(12) United States Patent
Cserey et al.

(10) Patent No.: US 9,594,353 B2
(45) Date of Patent: Mar. 14, 2017

(54) DEVICE AND METHOD FOR DETERMINING TIMING OF A MEASURED SIGNAL

(71) Applicant: Gyorgy Gabor Cserey, Budapest (HU)

(72) Inventors: Gyorgy Gabor Cserey, Budapest (HU); Adam Rak, Satoraljaujhely (HU); Balazs Gyorgy Jakli, Budapest (HU)

(*) Notice: Subject to any disclaimer, the term of this patent is extended or adjusted under 35 U.S.C. 154(b) by 0 days.

(21) Appl. No.: 14/894,654

(22) PCT Filed: May 31, 2013

(86) PCT No.: PCT/HU2013/000052
§ 371 (c)(1),
(2) Date: Nov. 30, 2015

(87) PCT Pub. No.: WO2014/191782
PCT Pub. Date: Dec. 4, 2014

(65) Prior Publication Data
US 2016/0109860 A1    Apr. 21, 2016

(51) Int. Cl.
*H03M 1/50*   (2006.01)
*G04F 10/00*   (2006.01)
(Continued)

(52) U.S. Cl.
CPC ........... *G04F 10/005* (2013.01); *H03K 3/356* (2013.01); *H03K 19/17748* (2013.01); *H03M 1/1033* (2013.01); *H05K 7/20* (2013.01)

(58) Field of Classification Search
CPC ......... H03M 1/1033; H03K 19/17748; H03K 3/356; H05K 7/20; G04F 10/005; G04F 10/00; G04F 10/06; G04F 10/04
(Continued)

(56) References Cited

U.S. PATENT DOCUMENTS

| | | | |
|---|---|---|---|
| 6,850,051 B2 * | 2/2005 | Roberts | G04F 10/06 324/76.54 |
| 7,062,733 B1 * | 6/2006 | Poskatcheev | G04F 10/06 716/113 |

(Continued)

FOREIGN PATENT DOCUMENTS

EP    1983650    10/2008

OTHER PUBLICATIONS

European Patent Office, International Search Report and Written Opinion of the International Searching Authority, Apr. 3, 2014.

*Primary Examiner* — Jean B Jeanglaude
(74) *Attorney, Agent, or Firm* — Wood Herron & Evans LLP

(57) ABSTRACT

Device and method for determining timing of a measured signal, the device has a plurality of flip-flop units (10), an evaluation module, an allocating module for allocating at least one path consisting of flip-flop units (10), and a calibration module being adapted for determining a time difference parameter of each flip-flop unit (10), the time difference parameter specifying for each flip-flop unit (10) a time difference between a period of time in which the measured signal (20) reaches the given flip-flop unit (10) and a period time in which the secondary signal reaches the given flip-flop unit (10), wherein the evaluation module is adapted for determining the timing of the measured signal from the output of the flip-flop units (10) located along the at least one path, on the basis of the time difference parameters.

21 Claims, 10 Drawing Sheets

(51) Int. Cl.
    *H03K 3/356* (2006.01)
    *H03K 19/177* (2006.01)
    *H03M 1/10* (2006.01)
    *H05K 7/20* (2006.01)

(58) Field of Classification Search
    USPC .............................. 341/155, 166, 156, 164
    See application file for complete search history.

(56) References Cited

U.S. PATENT DOCUMENTS

| | | | | |
|---|---|---|---|---|
| 7,205,924 | B2* | 4/2007 | Vemulapalli | G04F 10/005 341/155 |
| 7,423,937 | B2* | 9/2008 | Bolli | G04F 10/04 368/118 |
| 7,595,686 | B2* | 9/2009 | Maksimovic | G04F 10/005 327/176 |
| 7,629,915 | B2* | 12/2009 | Lin | G04F 10/005 341/164 |
| 7,667,633 | B2* | 2/2010 | Choi | G04F 10/005 327/156 |
| 7,786,913 | B2* | 8/2010 | Waheed | G04F 10/005 327/146 |
| 7,884,751 | B2 | 2/2011 | Shimizu | |
| 7,920,081 | B2* | 4/2011 | Waheed | G04F 10/005 331/17 |
| 2006/0055574 | A1* | 3/2006 | Maksimovic | G04F 10/005 341/155 |
| 2008/0315928 | A1* | 12/2008 | Waheed | G04F 10/005 327/159 |

* cited by examiner

DEVICE AND METHOD FOR DETERMINING TIMING OF A MEASURED SIGNAL

This application claims priority, under Section 371, to PCT Application No. PCT/HU2013/000052, filed on May 31, 2013

TECHNICAL FIELD

The invention relates to a device—to a so-called 'Time-to-Digital converter' (TDC)—and method implemented by an FPGA (Field Programmable Gate Array) architecture to determine timing of a measured signal. The timing of a measured signal means the timing/time of an event characterised by a rising edge, being associated with the measured signal, and arriving to the FPGA input with the measured signal.

BACKGROUND ART

In measuring techniques, measuring of time is of crucial importance, and it is used in numerous engineering applications. A time measuring device which produces a digital result from the timing of analogue signalling events practically carries out an analogue to digital conversion. The known time measuring devices characteristically operate in a way that when analogue signals associated with two events are supplied to the input of a time measuring device, the interrelated time difference between the two, i.e. the delay between the events of the two signals can be determined by a time measuring device. A discrete-time signal set appears on the output of the time measuring device, and this is principally an approximate value of the time difference between the input signals, obtained by quantising. The unit of the analogue to digital conversion performed in measuring the time, i.e. the resolution of the time measuring device, is the shortest time in which the increase or decrease of the input length of time already causes a change in the output value. The currently available time measuring devices are envisaged to determine time differences falling into picoseconds range.

Such a high accuracy time measurement is e.g. required in nuclear physics experiments. Timing chips are made primarily for measuring lifetime and velocity of detected elementary particles, and time measuring devices are used also for examining elementary particles in particle detectors. Further frequent fields of application of time measuring devices are depth measurement, ultrasonic measurement of temperature, density, flow and thickness, and magnetostrictive positioning, but time measuring devices may also be applied in laser rangefinders used in cartography and the construction industry.

Due to circuit integration, a number of time measuring devices have already become marketable today, but most of the devices available in trade can only be used to measure time simultaneously in a few channels only. A channel is generally characterised by two inputs, and the time measuring device measures the time shift of signals appearing on these inputs. These devices are generally implemented on a so-called special-purpose chip, i.e. on an integrated circuit which has been configured and manufactured especially for this task. This increases the production cost and inhibits the configuration of basic parameters.

Most of the earliest solutions to make a time to digital converter (TDC) were based on counting the clock signal cycles that occurred in the period between two events. This construction, however, has significant limitations regarding accuracy, because the length of the clock signal cycle will be the resolution of the measurement.

Other designs were also developed over time and among others scientific papers and patents deal with the structure and operation of high accuracy time-to-digital converter devices. Such devices are disclosed in U.S. Pat. Nos. 5,263,012, 6,181,649 B1, 6,754,613 B2, 6,850,051 B2, 7,928,888 B1, 8,050,148 B2 and WO 2013/007137 A1. Other devices and systems dealing with measuring of time are disclosed in US 2007/0271538 A1 and US 2011/0282625 A1. The construction disclosed in the latter document has a START and STOP input and is adapted for evaluating time intervals.

In U.S. Pat. Nos. 5,315,566 and 7,317,361 B2 such systems are disclosed, in which several clock signal emitting units are connected to the input of a time measuring device.

In U.S. Pat. No. 7,667,633 B2 a time measuring device adapted for measuring the time difference of two measured signals is disclosed. It is a great disadvantage of the apparatus described in this document and similar known devices that they are only able to measure the time difference between two signals, but they are unable to identify separately the timing of the two measured signals.

The known solutions can be grouped in two categories basically: on the one hand integrated special-purpose circuits, or on the other hand approaches implemented on FPGA and expressly based on a digital circuit are applied in them. The integrated special-purpose circuit approaches cannot be directly adapted to FPGA-based time-to-digital converters, because in many cases they have such integrated circuit elements which are not used in a conventional FPGA. In the known solutions implemented on FPGA, the delays of the wires cannot be well-controlled.

Most known solutions aimed at measuring time and determining the timing of a signal are based on the application of delay components, like for example the time-to-digital converter comprising an inner gate delay array and being disclosed in U.S. Pat. No. 8,219,346 B2. In these solutions, the resolution falls into the magnitude of the delay of the gates. One disadvantage of this solution is that it cannot detect a time increment smaller than the delay of the gates. A further disadvantage of this approach is that the inner gate delay array puts a significant thermal noise burden on the measurement, which may deteriorate the accuracy further.

Such a solution is also disclosed in U.S. Pat. No. 7,884,751 B2, showing the time delays applied between the pluralities of flip-flops, and the shortest such delay is 30 ps, but the delays are characteristically around 100 ps, i.e. the available accuracy of the time measuring device according to the document is rather limited.

In U.S. Pat. No. 8,390,349 B1 such a complex time measuring device or TDC (time-to-digital converter) is disclosed in which delays are applied and the accuracy is enhanced by the combination of various types of time measuring devices. In one part of the time measuring device called 'stochastic TDC', the parameter uncertainty resulting from the production of certain elements, e.g. flip-flops, is utilised; i.e. the fact that the various flip-flops cannot be produced absolutely identically from an electronic aspect, e.g. regarding the responses given to signals. In the unit according to the document, the various elements having certain deviation parameters are connected in parallel.

There are tasks where there is a high demand for multi-channel time measuring devices: such a need is e.g. to determine the 3D spatial localisation of events taking place in a particle physics detector with high—even centimetre— accuracy. In other particle physics experiments, it is also necessary to use multi-channel time measuring devices. For such purposes, currently only relatively low accuracy very expensive devices are available. Therefore, a need has emerged for a cost efficiently producible, high accuracy, multi-channel time measuring device adapted for determining timing of a signal, which could even be used for performing measurements physicists were unable to do earlier, and furthermore in multi-channel digital logical analyser devices, where a high resolution is required.

DESCRIPTION OF THE INVENTION

The object of the invention is to provide such a device and method for determining timing of a measured signal, which is free of the disadvantages of the prior art solutions to the greatest possible extent.

A further object of the invention is to provide such a device and method for determining timing of a measured signal, which device can be produced cost efficiently by means of mass production, it is not sensitive to the changing quality and configuration stemming from mass production, and by which the absolute timing of a signal associated with an event can be measured with a high accuracy.

The objects of the invention can be achieved by the device according to claim 1, and the method according to claim 14. Preferred embodiments of the invention are defined in the dependent claims.

BRIEF DESCRIPTION OF THE DRAWINGS

Preferred embodiments of the invention are described below by way of example with reference to the following drawings, where.

MODES FOR CARRYING OUT THE INVENTION

Figure 1:
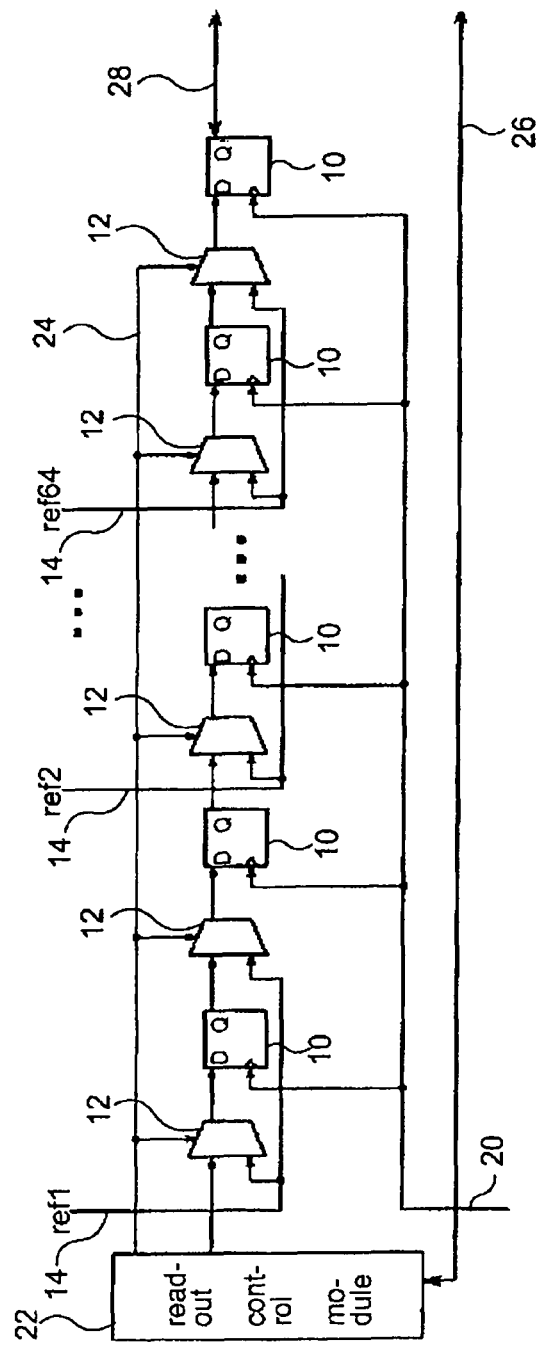
FIG. 1 is a circuit diagram showing an embodiment of the device according to the invention.

The device according to the invention is adapted for determining timing of a measured signal. The device comprises a plurality of flip-flop units, each having a clock signal input for receiving the measured signal and a data input for receiving a secondary signal, and an evaluation module adapted for evaluating outputs of the plurality of flip-flop units. In the device according to the invention, the plurality of flip-flop units—the ensemble of flip-flop units—is arranged on an FPGA architecture. The device according to the invention furthermore comprises an allocating module for allocating at least one path consisting of flip-flop units, wherein the measured signal and the secondary signal are led to the flip-flop units of the at least one path. The tasks of the allocating module are characteristically performed by means of a compiler module being part of the FPGA development environment. It is specified to the allocating module how many paths, i.e. how many measuring channels are needed (the number of measured signals, the timing of which is intended to be determined), and it allocates a corresponding number of paths through the flip-flop units. For a number of various measuring channels, the paths may be pre-allocated, so as to avoid a time delay when switching to a different number of measuring channels. The device according to the invention also comprises a calibration module adapted for determining a time difference parameter of each flip-flop unit, the time difference parameter specifying for each flip-flop unit a time difference between a period of time in which the measured signal reaches the given flip-flop unit from an input point of the measured signal, and a period of time in which the secondary signal reaches the given flip-flop unit from an input point of the secondary signal. The device according to the invention comprises such an evaluation module, which is adapted for determining the timing of the measured signal from the output of the flip-flop units located along the at least one path, on the basis of the time difference parameters.

In comparison with several known devices adapted for determining timing, a great advantage of the device according to the invention is that it is implemented on a generally configured FPGA adapted for performing a number of various tasks and not on a special-purpose chip designed expressly for this purpose. Implementing the device according to the invention on an FPGA entails a much lower manufacturing cost than that of the usual time measuring devices. Besides this, as shown below, the device according to the invention can achieve the same or better accuracy than the high manufacturing cost devices which are adapted for determining timing and are based on very expensively manufactured special-purpose chips.

The device according to the invention realises practically a stochastic based time measuring circuit as discussed below. According to the invention, one of the signals is a secondary signal practically applied as a reference, which is e.g. generated with an oscillator farm, and the other signal is the received measured signal; it is intended to determine the timing of the measured signal through the time difference of the rising edges therein. In some embodiments of the invention, a square wave signal is applied as a secondary signal, and in this case a single rising edge of the square wave signal plays a role.

In the device according to the invention, in accordance with the description above, flip-flop units, e.g. D flip-flop binary switches are arranged practically randomly on the surface of an FPGA chip. Through the wiring, both a measured signal and a secondary signal applied as a reference clock signal are led respectively to the clock signal input (latch input) and data input (input D in the figures) of each flip-flop unit (or shortly flip-flop). Depending on whether the measured signal or the secondary signal reached the flip-flop unit earlier, the given flip-flop picks up a 0 or 1 value.

On the FPGA, the flip-flops are accessible through a pseudo-random wiring. The pseudo-random character of wiring contributes to the favourable resolution of the FPGA-based device according to the invention and being adapted for determining timing. Practically, on the FPGA, various lengths of wiring are associated with each flip-flop due to the technological deviations stemming from the manufacturing of the FPGA, and therefore the signal reaches each flip-flop in a different period of time. The measurement will tell which signal reaches earlier each of the flip-flops taken into consideration during the measurement.

By means of the device according to the invention, a timing of several different signals can be measured simultaneously by using a reference signal, and accordingly in line with the discussion above, the allocating module of the FPGA allocates a path to each such channel on the FPGA, and flip-flop units are located along these paths. It will be detailed later on that as a reference—which is practically the secondary signal—a reference source may be applied, for example the oscillators of a crystal array or the signal of another measuring channel. The random configuration of wiring scatters the delay of the various flip-flops, i.e. due to the different lengths of the wires leading to each flip-flop from the input of the measured signal, the measured signal and the secondary signal reach the flip-flop units with a number of different delays, and therefore the measured signal will be sampled with numerous different delays. By means of this sampling, the rising edge of the measured signal can be examined closer, because the measured signal and the secondary signal will have numerous different shifted 'encounters'. In developing the delay, the wiring plays the most significant role and the pseudo-random character of wiring makes sure that the reference signal and the signal to be measured arrive at each flip-flop with a different timing in relation to each other.

In the device according to the invention, the measured signal i.e. the incoming signal to be measured triggers (in other words latches or locks) the flip-flop, and as a result of this triggering, the flip-flop takes a sample from the secondary signal used as a reference. Depending on the accuracy to be achieved, one path i.e. a channel adapted for determining the timing of a single measured signal, may comprise a varying number of flip-flop units. The number of flip-flop units located along one path is not only determined by the accuracy, but also by the number of various measured signals the timing of which is intended to be measured at a time, i.e. the number of paths or channels by which the flip-flops on the FPGA chip are divided.

From a reference signal, i.e. a secondary signal, many flip-flop units located along a path take a sample, and therefore an array consisting of zeros and ones, i.e. a stochastic bit flow is obtained for the measured signal, and from this flow—by means of the calibration applied according to the discussion above—the timing associated with the event of the measured signal, i.e. with its rising edge, that is the timing of the measured signal, can be calculated. In determining the timing, the simplest solution is if on the basis of time difference parameters obtained during the calibration, weights are assigned to the zeros and ones coming from the various flip-flops, i.e. practically the sum of zeros and ones is weighted. Even more preferably, the most probable value of timing is determined by a maximum likelihood estimate from the available data (time delay parameters and bit flow). To this end, it is necessary to know the delay of the flip-flops—in the case of both the measured signal and the secondary signal—preferably with at least a picosecond accuracy, and the frequency of the secondary signal or signals—in a number of embodiments the frequencies of reference signals—and in the case of several signals the phases of the signals compared to one another. Because the switching velocity of semi-conductor material based circuit components applied in the device according to the invention is strongly temperature dependent, preferably the sub-units of the device are subjected to thermal stabilisation, and the calibration is carried out for the given temperature. The thermal stabilisation and the related aspects of the device will be detailed below.

The calibration of the device according to the invention is performed as follows. Because of the differences resulting from serial production, each such FPGA architecture on which the device according to the invention is implemented requires thorough calibration. Each manufactured FPGA needs individual calibration, because on each FPGA the converter software preparing the FPGA hardware realisation—i.e. the determining of the paths—may define a number of various physical wiring configurations, and each FPGA has individual manufacturing inaccuracies. The device according to the invention and adapted for determining timing of a measured signal may be implemented even by means of many FPGAs.

The calibration module preferably uses a pulse generator for generating the appropriate calibration signals. By means of the allocating module, paths—channels—are allocated, and then the calibration module is applied to measure the time difference parameters associated therewith for each flip-flop unit in each channel. Accordingly, the calibration can be carried out for example through the use of the pulse generator, by which known and various time difference pulses are supplied to the device, i.e. to the measured signal input and secondary signal input associated with the path comprising the given flip-flop, and therefore once the parameters are known—e.g. through the changing of the known time difference—the time difference parameters characterising each flip-flop unit of the FPGA can be mapped. In this way, it is determined how much delay the signals reaching the device are subjected to until the measurement (sampling) is carried out by the flip-flop, i.e. the difference in time between the signal propagation on the wiring from the signal input to the given flip-flop, and the signal propagation on the wiring from the reference input to the given flip-flop. It is not possible to go authentically below the resolution of the pulse generator, but the jitter (the stochastic error of a period of time in the signal by accurate frequency) can be eliminated by averaging.

FIG. 1 is a circuit diagram which depicts one embodiment of the device according to the invention. In the embodiment shown, a plurality of flip-flop units 10 are located along the path which has been marked by three dots in the figure. The path is defined by a chain of the flip-flops 10 connected to each other. The figure shows an embodiment where the device according to the invention comprises a plurality of reference transmitters adapted for creating the reference signals 14, and as several secondary signals, the reference signals 14 are each led to the data input of at least one flip-flop unit 10 located along the at least one path. The reference signals 14 tagged ref1 to ref64 in the embodiment shown in the figure, are each assigned to two flip-flops 10. Such embodiments are also conceivable, where a higher number of flip-flop units 10 are assigned to each reference signal 14. It is shown in FIG. 1 that the measured signal 20 is fed to the clock signal input of each flip-flop 10. The reference signal transmitters are preferably crystal oscillators described in detail below.

In the embodiment of FIG. 1, the device according to the invention comprises a readout control module 22 adapted for emitting a control signal, and multiplexers 12 receiving the control signal, and being connected to the data input of the plurality of flip-flop units 10 located along the at least one path, respectively. Furthermore, the multiplexers 12 have a first input connected to the output of the flip-flop unit 10 located along the at least one path preceding or to the output of the readout control module 22, and have a second input receiving the secondary signal. In this embodiment, the secondary signal is led to the data inputs of the plurality of flip-flop units 10 via the multiplexers 12. In the case of receiving a measuring mode control signal the secondary signal, or in the case of receiving a readout mode control signal the signal on their first inputs is led to their outputs by means of the multiplexers 12.

In the present embodiment, the readout control module 22 can be controlled via a wiring 26, by means of a module responsible for control. The signal appearing on the output (output Q) of the last flip-flop 10 associated with the given measured signal is passed on by means of a wiring 28.

In this embodiment, the device may operate in a measuring mode and in a readout mode, and these modes can be applied alternatively one after the other and not simultaneously. Among these modes, the readout control module 22 switches over by means of the multiplexers 12. In the measuring mode, the flip-flops 10 take a sample from the reference signals, triggered by the input event, i.e. the measured signal. In the readout mode, the same flip-flops 10 operate as a so-called shift register, and they each feed to their output the measuring result received by their input from the preceding flip-flop 10. The result is passed on by the last flip-flop 10 to the wiring 28 responsible for supplying the data.

In the present embodiment, to allow that the timing of the measured signal is determined so that instead of comparing the deviation between the two input measured signals, a clock signal type secondary signal and the measured signal or signals is (are) compared (in the case of several input signals, independently and in parallel several flip-flop chains, i.e. the measuring channel shown in FIG. 1 can be implemented), it is necessary to have an appropriate reference signal. This reference signal has to be accurate and it shall have a low jitter. To establish the reference signal, for example a crystal array or an oscillator array can be applied, which e.g. consists of sixty-four clock signal generating oscillators of 20 ppm frequency accuracy. In the course of the measuring process, a stochastic technique is applied, and thereby it can be achieved that the many reference signals having a jitter can be used as if a single low jitter clock signal were available. The frequencies of crystal array oscillators is preferably at least 100 MHz, and by applying oscillators of such a frequency, by means of the device according to the invention the timing of the events of the measured signal, preferably that of a rising edge can be determined with an accuracy of approx. 10 ns—which is an accuracy corresponding to one period of the oscillator. In the course of sampling, i.e. the time measurement, the flip-flops compare in parallel the input signal with the square wave signals provided as a reference signals by the independent crystal oscillators, respectively. In the case of each reference signal, a value of 1 or 0 is obtained, and the sequence number of the pulse (period) of the reference signal of the given oscillator where the said reference signal has an encounter with the measured signal in one flip-flop can be determined. Subsequently, by means of the time difference parameters obtained by calibration, it is accurately determined when the event took place within a period.

In the present embodiment of the device according to the invention, the input measured signal and reference signal are compared, and thereby the timing of an event—e.g. the rising edge of the signal—is determined practically by an infinite measuring range, and practically any inaccuracy is entailed only in determining the timing by the frequency error of the crystals. Inaccuracy may result from that the frequency of the crystals changing slowly, even in the case of steady temperature (aging), and also from the fact that the reference signal of the crystals has a jitter, which can only be reduced, but not eliminated according to the discussion below. This inaccuracy (error) can be decreased in a way that a reference calibration module continuously measures the frequencies of the reference signals of the crystals compared to each other or e.g. to an atomic clock. Each crystal oscillator has different aging dynamics, but except for aging all parameters are calibrated, and therefore, due to the temperature stabilisation mentioned above, the frequency accuracy is approximately 1 ppb (parts per billion), i.e. the standard OCXO (Oven Controlled Xtal Oscillator) accuracy. However, due to the many crystal oscillators, the jitter is much smaller $\sqrt{(1/64)}=1/8$, if a sufficiently large number of various signals stemming from the plurality of oscillators are used in a given measurement. Furthermore, making use of the fact that the crystals have different aging tendencies, the absolute accuracy of the actual frequency can be estimated also on the basis of the frequency measurement taken in relation to one another. Therefore, with a frequent calibration, an accuracy approximating that of the rubidium atomic clock is conceivable, but in any case it is a higher accuracy than that of the standard OCXO.

Preferably, the crystal oscillators of the crystal array oscillate independently of each other. The relative frequency and relative phase of the crystal oscillators are also measured. The relative phase of several independent clock signals shows stochastic behaviour, and therefore with the simultaneous use of sixty-four different reference signals stemming from one crystal array used by way of example, their accuracy can be expected to be slightly lower than 1 ns (it would be 10 ns/64 if they had a uniform distribution, but in reality this would not happen and the accuracy will approach 1 ns from lower values).

Figure 2:
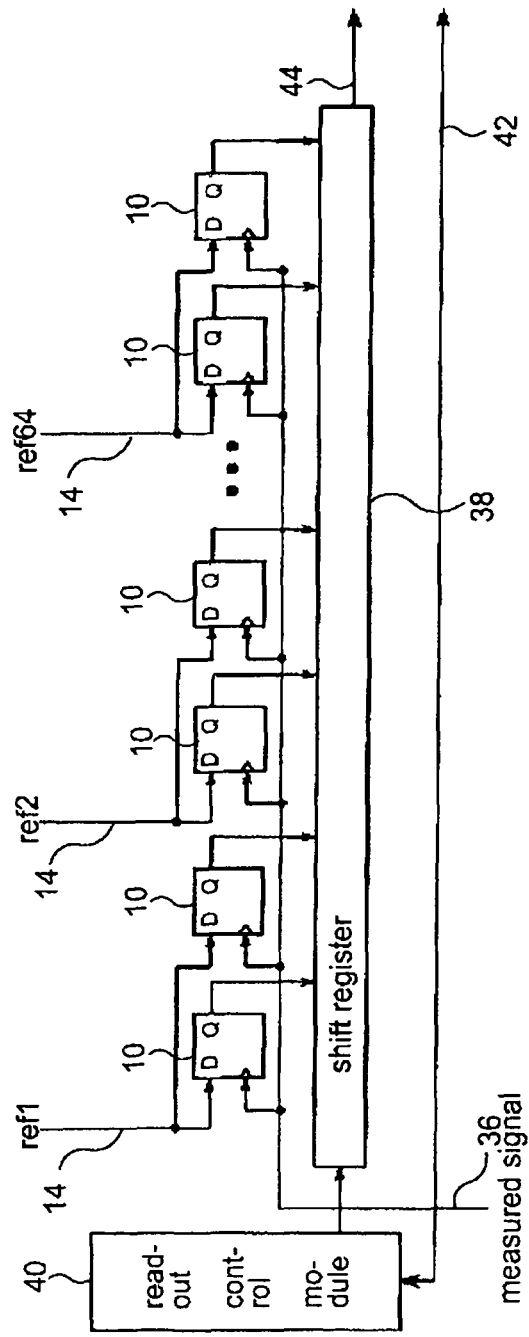
FIG. 2 is a circuit diagram showing a further embodiment of the device according to the invention.

The embodiment shown in FIG. 2 has a similar configuration than that of FIG. 1, but in this embodiment no multiplexers are used. In this embodiment, the device according to the invention comprises a readout control module 40 adapted for emitting control signal, and at least one shift register 38 receiving the control signal and connected to the output of the plurality of flip-flop units 10 located along the at least one path. The operation of the readout control module 40 deviates from that of the readout control module 22, because in this embodiment, readout of the bit flow obtained from samplings performed by the flip-flops 10 is carried out with the shift register 38. The reference signals 14 are led also in the present embodiment to the data inputs of each two flip-flops 10, and a measured signal 36 is led to the clock signal input of the flip-flops 10. Data of the shift register 38 can be read out through a wiring 44, and the readout control module 40 can be controlled through a wiring 42.

In the embodiment of FIG. 2, similarly to that of FIG. 1, an absolute measurement is implemented. In this embodiment, again two alternative application modes can be realised, the measuring mode and the readout mode. In measuring mode, the flip-flops 10 take a sample from the reference signals 14, triggered by the input event provided by the measured signal 36. In readout mode, by means of the shift register 38 dedicated especially to this purpose, the result of the measurement is supplied to the output, i.e. to the wiring 44, and this result—similarly to the discussion above—is a bit flow consisting of several 1 and 0 provided by the flip-flops. Compared to the embodiment depicted by FIG. 1, it is a significant difference that in the embodiment of FIG. 2, the two modes can operate simultaneously, but, since the shift register 38 is also e.g. implemented by flip-flops, the implementation of the present embodiment requires twice as large an area on the FPGA.

Figure 3:
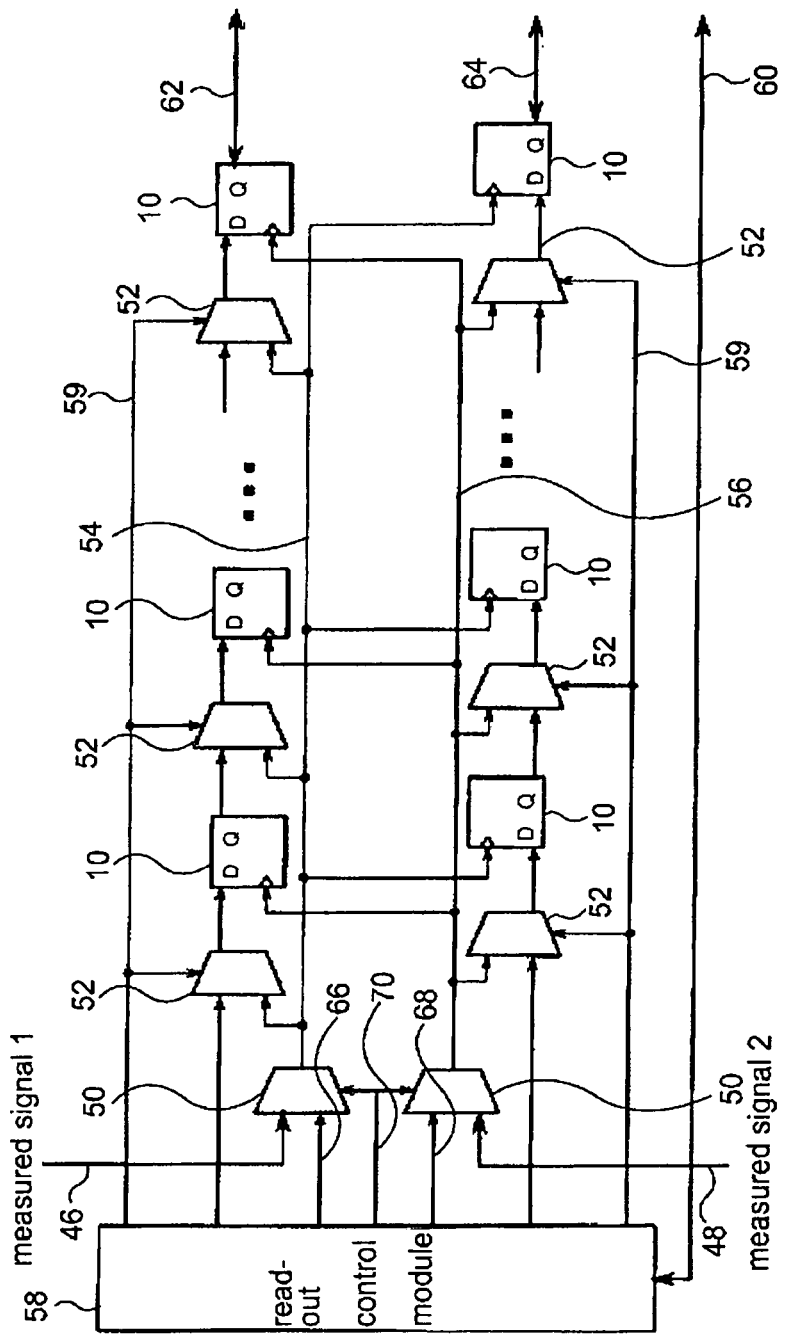
FIG. 3 is a circuit diagram showing a yet further embodiment of the device according to the invention.

FIG. 3 shows an embodiment, in which—because the timing of at least two measured signals is intended to be determined—a first path and a second path are allocated by the allocating module. The first path is shown in the upper part of FIG. 3 and the output of the last flip-flop 10 is connected to a wiring 62. The second path can be seen in the lower part of the figure, and the output of the last flip-flop 10 is connected to a wiring 64. In the present embodiment, a measured signal 48 is led respectively to the clock signal input of the plurality of flip-flop units 10 located along the first path, and the second measured signal 46 is led as a secondary signal to their data input. Furthermore, the second measured signal 46 is led respectively to the clock signal input of the flip-flop units 10 located along the second path, and the measured signal 48 is led as a secondary signal to their data input. Therefore, in the present embodiment, each pair of channels practically supply a reference signal to each other, and accordingly it is not necessary to apply a separate reference signal.

In the present embodiment, the device comprises a readout control module 58, which is connected through two wirings 59 to multiplexers 52 which are in turn connected to the data input of the flip-flops 10 similarly to the embodiment of FIG. 1. The readout control module 58 is controlled through a wiring 60 in this embodiment. Because of the presence of the two measuring channels, it is necessary to use two multiplexers 50, to which the measured signal 46 and the measured signal 48 are connected; in addition through wirings 66 and 68, the readout control module 58 is each connected to their inputs, respectively. The readout control module 58 is connected also to the input of the multiplexer 52 arranged as the first in the row. A wiring 54 connected to the output of the multiplexer 50 associated with the first channel is connected to the input of the multiplexers 52 of the first path and to the clock signal input of the flip-flops 10 of the second path. And, a wiring 56 connected to the output of the multiplexer 50 associated with the second channel is connected to the input of the multiplexers 52 of the second path and to the clock signal input of the flip-flops 10 of the first path. By such a system of the multiplexers 50, 52 and the channels connected thereto, an analogue behaviour with the embodiment of FIG. 1 can be ensured in the case of two channels, and, by this arrangement the appropriate measured signals 46, 48 can be led to the appropriate inputs.

In the embodiment of FIG. 3, two measuring channels being relative to each other are implemented. The measuring channels have two alternative application modes, the measuring mode and the readout mode. Between these modes, the readout control module 58 switches over by means of the multiplexers 50, 52. In measuring mode, the flip-flops associated with the first path take a sample from the measured signal 46 as a result of an event associated with the measured signal 48 and vice versa. This sampling is implemented similarly to the sampling from the reference signal, and accordingly the absolute timing of the measured signal can be determined by means of the relative measuring channels.

In readout mode, similarly to the discussion above, the flip-flops 10 of each path operate as a shift register, thereby feeding the result of the measurement to the wirings 62 and 64 connected to the output. Due to the symmetric structure, two shift registers are implemented in the present embodiment in readout mode.

If the events associated with the signals reach the device according to the invention appropriately close in time, a high accuracy measurement can be realized. However, for executing the measurement carried out by the relative channels, the rising edges associated with the events in each measured signal cannot be too far from each other, because the pulses must be on the FPGA simultaneously. In a relative measurement, there is no jitter problem, because no reference is applied. With the increasing of the measuring range, i.e. in order to cover the increasingly higher time differences, more and more flip-flops are required in each channel, and therefore the FPGA surface required for one channel also increases. If the measuring range is expanded, the surface occupied on the FPGA by each measuring channel, i.e. the first path and the second path, grows linearly. The comparison of the two signals is carried out symmetrically, i.e. both signals play the roles of the measured signal and the reference simultaneously. This symmetry facilitates the increasing of the measuring range and the decreasing of the noise.

Figure 4:
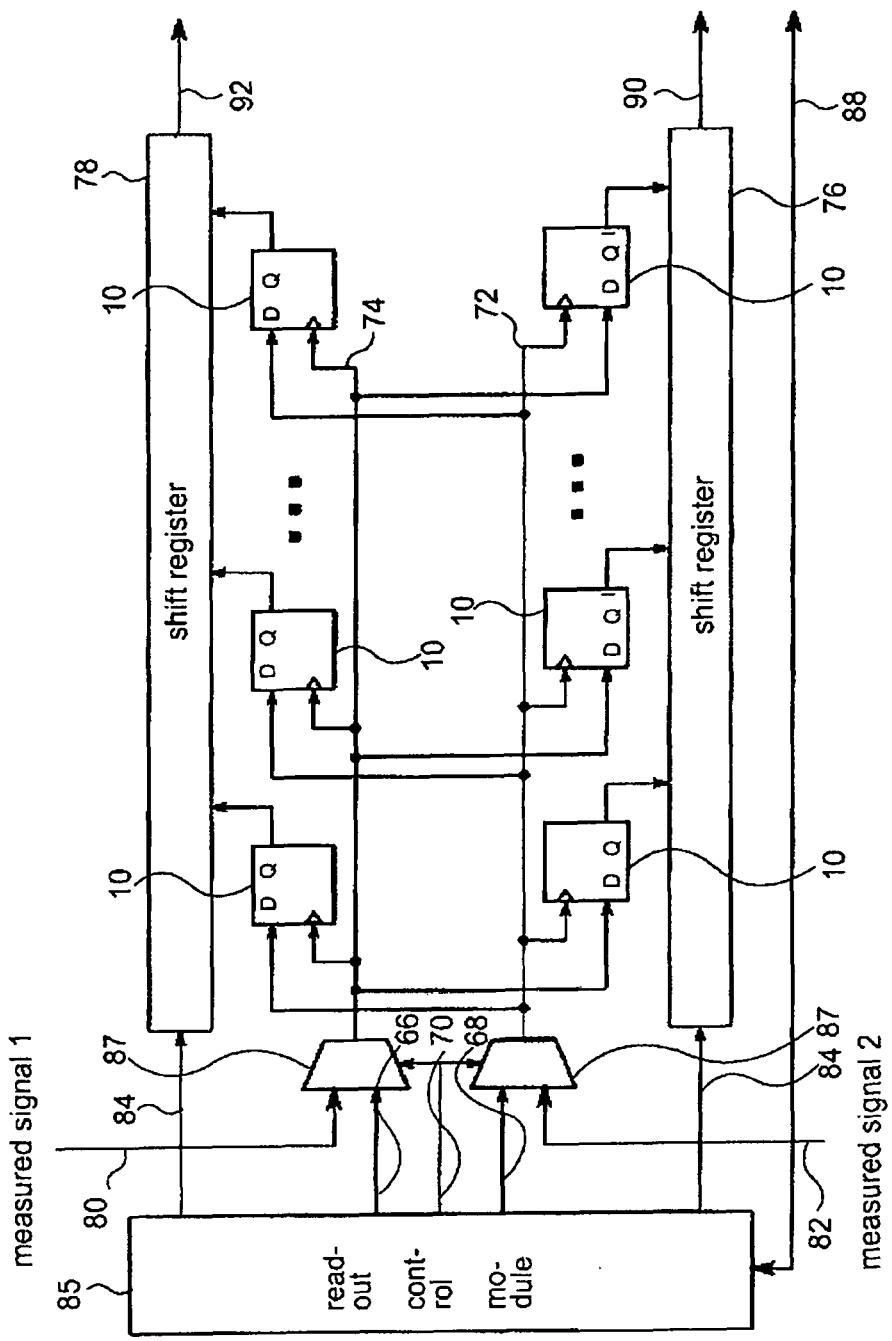
FIG. 4 is a circuit diagram showing an embodiment of the device according to the invention.

FIG. 4 shows an embodiment similar to that of FIG. 3. Readout of samplings is performed similarly in this embodiment to that of FIG. 2. Accordingly, this embodiment comprises a readout control module 85, and a shift register 78 receiving the output of the flip-flops 10 of the first path, and a shift register 76 receiving the output of the flip-flops 10 of the second path. In order to make sure that the measuring mode and the readout mode of each path can be combined arbitrarily, measured signals 80 and 82 are connected to multiplexers 87, respectively, and through them they reach the data input and clock signal input of the appropriate flip-flops 10. The readout control module 85 is respectively connected through wirings 84 to the shift registers 76 and 78, and it is controlled through a wiring 88. The shift registers 76 and 78 each transfer the bit flow resulting from the sampling to wirings 90 and 92.

Figure 5:
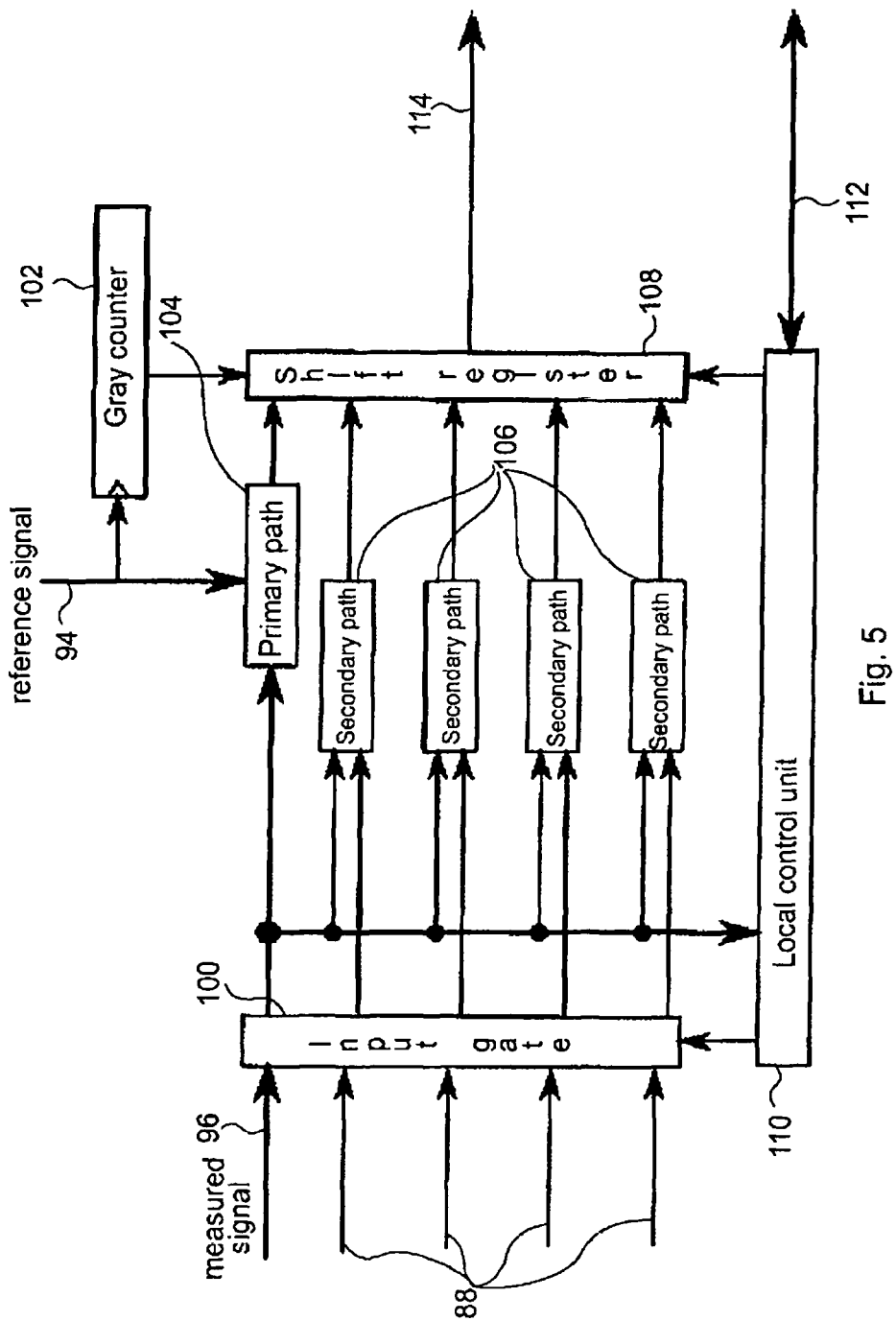
FIG. 5 is a block diagram showing an embodiment of the device according to the invention.

A further embodiment of the device according to the invention is shown in FIG. 5. In this embodiment, a primary path and at least two secondary paths are allocated by the allocating module, the measured signal is led to the clock signal input of the plurality of flip-flop units located along the primary path, and the secondary signal is led to the data input thereof, measured signals with voltage shifts being different from each other for each secondary path are led to the clock signal inputs of the plurality of flip-flop units located along the at least two secondary paths, and the measured signals are led to the data input thereof. The present embodiment is adapted for determining the rise time of the event associated with the measured signal according to the followings.

The rise time is the time period during which the signal switches from a level 0 to a level 1. The device according to the invention measures the timing of the occurrence of the 0-1 transition of the digital inputs, but in practice all signals are analogue. By definition, an analogue signal is turned into a digital signal if a threshold level is defined above which the signal can be interpreted as 1. The signal arrives in the form of a voltage pulse, and therefore the threshold level is a voltage value. Through this fixed threshold level, the rise time makes a direct impact also on the measured time.

But, the rise time may vary due to technical reasons, and therefore it also makes an impact as noise on the measured time. This is especially true, if the rise time is larger than the desired accuracy in time measurement. Since the 0-1 transition cannot be considered to be discrete in these cases, it is not sufficient to measure the time of exceeding the given threshold level on the incoming measured signal.

The rise time is determined according to the following. In this embodiment, the timing of a measured signal 96 along a primary path 104 is determined by means of reference signals 94 and the measured signal 96 in accordance with FIG. 5, similarly to the embodiment shown in FIG. 1 or FIG. 2. In line with the figure, four secondary paths 106 are also allocated in this embodiment. The relative measuring principle detailed above manifests between the paths 104 and 106. As a measured signal, these secondary paths receive a signal created by voltage dividing from the measured signal of the primary channel, and according to the relative measurement principles the signal is compared to the measured signal of the primary path, and it is used as a reference according to the connections shown in the figure. The figure shows that from the measured signal 96 of the primary path, by means of a resistance divider, measured signals 88 subjected to different voltage shifts are established, and then led to the clock signal input of the flip-flops of the secondary paths 106. FIG. 5 shows that the voltage shifted measured signals 88 are led to the secondary paths 106 through an input gate 100 adapted for controlling of the measured signals 88 and 96. Due to the relative measurement, in line with the description above, the secondary paths realize small measuring range, but very accurate timing measurement. By the secondary channels, the resistance divider shifts the threshold level in a known manner, and therefore the timing is adapted to a different point of the rise time, to an earlier point of time than the primary path. The threshold level is characteristically reduced, and therefore the voltage shifted measured signals are measured as if they reached the threshold level earlier, at an intermediate point of the rising edge.

Each secondary path determines shifted timings even relative to each other also in comparison with the primary path, and therefore it can be measured at several points when and which threshold level was exceeded by the rising edge of the measured signal 96, and therefore the signal shape of the measured signal 96 can be reconstructed in the vicinity of the rising edge associated with the event. In digital electronics, the threshold level cannot be adjusted, but the shifting of the basic level—the DC level—of the signal with the resistance divider is equivalent with this. On the basis of the signal shape so reconstructed, the rise time can be determined, and once the measured signal 96 is qualitatively known, the timing of the event intended to be measured can be determined. Accordingly, in the present embodiment, the determination of the timing can be made more accurate by identifying which point of the rise between the signal levels 0 and 1 is assigned to the occurring of the event.

According to FIG. 5, in the present embodiment, the device comprises Gray counters 102 adapted for examining the reference signals and representing the input of the reference calibration module. Accordingly, the reference signals 94 are sampled and examined by means of the Gray counter 102 on the input of the module responsible for calibration; by means of the Gray counter 102, it can be exactly determined which period the clock signal is currently in.

The primary path 104 and the secondary paths 106 are connected to a shift register 108, which transfers the bit flows provided by each path 104 and 106 to a wiring 114. The control of the input gate 100 and the shift register 108 is carried out by means of a local control unit 110, which is connected via a wiring 112 to the modules of the device.

By determining the rise time, a time measurement of high accuracy can be implemented in such applications, where this has not been possible so far. The known timing devices could not be used in such applications, where the rise time was dominant. By means of the present embodiment of the device according to the invention, the shape of the rising edge can be measured according to the discussion above, and then on the basis of the measuring points, the rising edge can be modelled. The present embodiment of the device according to the invention can be applied e.g. for laser range finders calculating on the basis of the time difference of pulses the time elapsing while the pulses travel along the path (through the use of outgoing and incoming pulses). The classical range finders determine the elapsed time on the basis of analysing the phase of the laser signal, and this time proves to be slow. By means of the known devices it is not possible to carry out approx. 100 million measurements per second, but by means of the device according to the invention such a measuring speed is available and an extremely fast so-called time-of-flight range finding can be implemented. In the device according to the invention, the measuring channels i.e. the various paths are independent, and therefore the device scales well and the time measurement can be carried out simultaneously with many channels, i.e. the timing of the measured signals can be determined.

Figure 6:
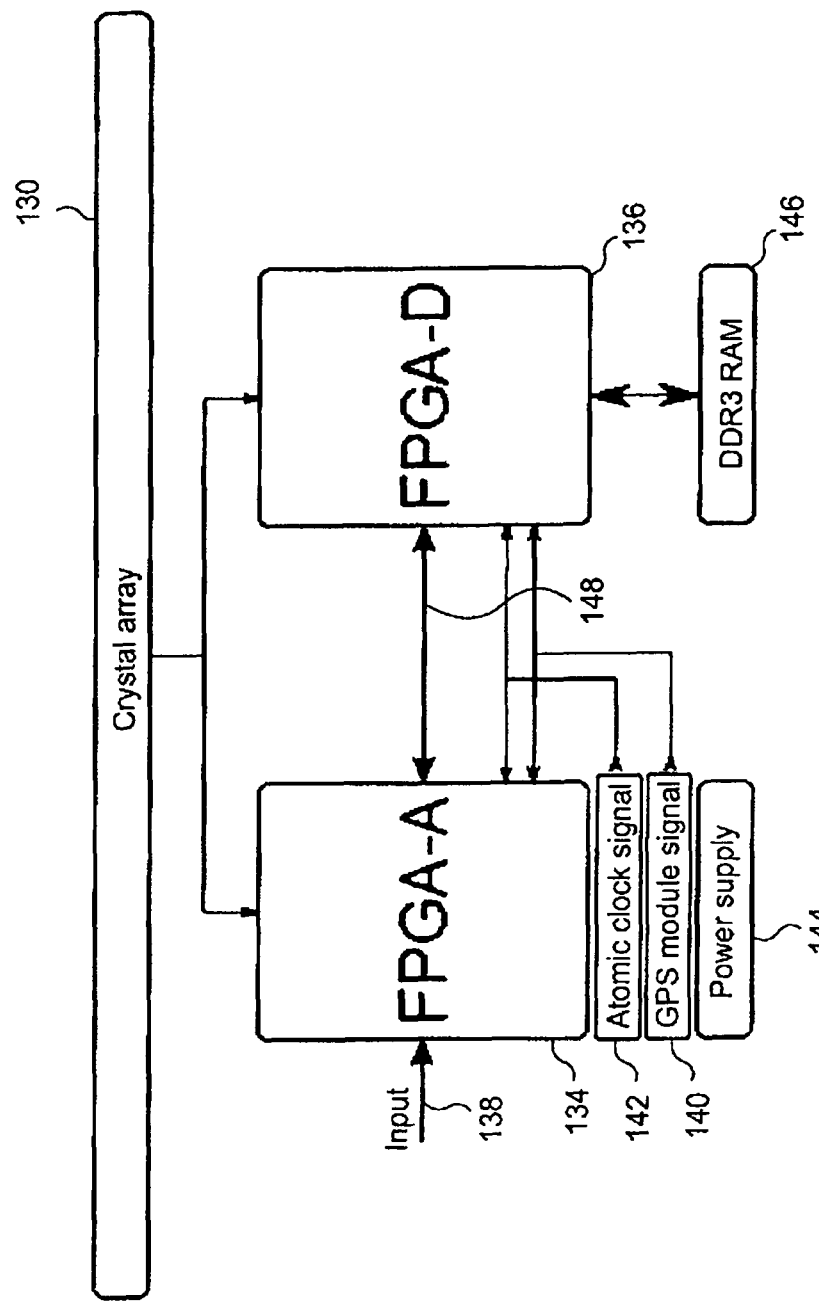
FIG. 6 is a block diagram showing an embodiment of the device according to the invention.

FIG. 6 is a block diagram of a further embodiment of the device according to the invention. In this embodiment the plurality of flip-flop units is arranged on a first FPGA architecture 134, while the allocating module, the calibration module and the evaluation module are arranged on a second FPGA architecture 136. In FIG. 6, the sampling flip-flop units necessary for determining the timing are located on the first FPGA architecture 134 marked as FPGA-A, and the module of the other sub-units of the device according to the invention is arranged on the second FPGA architecture 136 marked as FPGA-D. Accordingly, the control functions of the device are also performed by the FPGA-D architecture. The tasks of the FPGA-D architecture are by way example the following partly discussed below:

measuring and categorising the reference clock signals of the crystal array;
user interface, communication with the computer;
stabilising the system temperature;
saving of data on SD memory card;
handling of DDR3 RAM memory;
handling of GPS module.

The digital electronic circuits take on the current at a rate corresponding to their clock signals, and this causes a periodical voltage and current fluctuation in their immediate vicinity. This phenomenon would introduce quite a noise into the time measuring process, and therefore it is advantageous to synthesise these tasks on an FPGA separate from the FPGA containing the flip-flops responsible for determining the timing, regardless of the exploitage of each FPGA.

The marking of each FPGA indicates that the FPGA-A architecture has an analogue use: the determining of the timing of measured signals is performed in an analogue way due to the sampling. On the contrary, FPGA-D performs the functions above in accordance with the digital principles.

In accordance with the discussion above, the FPGA-A is responsible for time measurement; it receives a measured signal 138. The FPGA-D is responsible for control, i.e. it plays a control role in time measurement and temperature stability (controlling a temperature sensor, a Peltier element, and a fan), and preferably measures and samples on an ongoing basis the parameters of crystal array 130 and therefore also the reference signals. The further tasks of FPGA-D could be the temporary storage of the raw (unprocessed) data of time measurement—e.g. on DDR3 RAM 146

—, and the FPGA-D processes the raw data and determines the timing associated with each time measuring channel. If necessary, the measured statuses of the crystal array 130 and the timing rates are saved on an SD card. Between the FPGA-A and FPGA-D, a bus 148—which is e.g. of the LVDS (Low-voltage differential signalling) type—is used for transfer of the raw data of timing determination. The measured signals 138 are the input signals representing the events subjected to timing measurement. A module 142 providing atomic clock signal and a module 140 providing GPS signal can be optionally connected to the FPGA architectures, which can be used as follows for the automatic calibration of the crystal array. In one embodiment of the device according to the invention, the reference signals provided by an plurality of reference transmitters use the signal of an atomic clock or a GPS module, and they are calibrated by a reference calibration module.

The user interface is implemented on an embedded PC which can be connected to the FPGA-D. The embedded computer functions may be performed e.g. in the device by a small embedded Linux-based computer, a Raspberry PI (http://en.wikipedia.org/wiki/Raspberry_Pi). This module will communicate on an I²C bus with the FPGA-D. A GPIO (General Purpose Input/Output) may also be connected to the FPGA-D.

According to the description above, the frequency of reference signals provided by the crystal array can be preferably calibrated. This is required to know exactly the frequency of the signal supplied by each crystal oscillator at the given temperature. The calibration of the reference signals can be performed by a signal coming from an atomic clock or a GPS, and the frequency of the reference signal of each crystal oscillator can be accurately measured by comparison thereto. Most of the standard GPS modules provide a 1 Hz reference clock signal, which has up to 100 ps jitter, and on this basis the calibration is slower (it may even be 2 to 3 hours instead of 10 minutes) than directly with an atomic clock. To this end, it is necessary to cool the device and stabilise the temperature with a 0.1° C. accuracy.

The absolute accuracy of a device according to the invention and being adapted for determining the timing can be enhanced, if a reference signal of appropriate accuracy is available. The crystal array is used to provide the reference clock signal even without an atomic clock. The installation of an atomic clock could largely increase the manufacturing cost of a time measuring device. However, for the calibration of a crystal array, it is necessary to have a high accuracy signal, by way of example the signal of an atomic clock.

The calibration of reference signals can be done in two ways. On the one hand, an e.g. rubidium based atomic clock can be connected to the device, for the calibration thereof by a reliable signal of high frequency (kHz, MHz). This enables fast calibration, but it requires the presence of an atomic clock. On the other hand, the calibration can be performed also by means of a GPS module connected to the device, which said module also supplies an accurate signal of 1 Hz frequency. The price of a GPS module is very low in comparison with an atomic clock, but it only enables a relatively slow calibration. The time period of calibration may even be several hours depending on the accuracy to be achieved. Furthermore, for the time of the calibration the device must be placed in a location where the GPS signals are available, i.e. practically in the vicinity of a window or in other free spaces where a large part of the sky is visible. It could be an optimal solution to calibrate the device at the time of production with an atomic clock, and then after this at specified intervals the calibration is fine tuned by means of the GPS module, thereby compensating the 'aging' of the crystals. This method entails the limitation that it is required to locate the device on an ongoing basis in the vicinity of a window.

In the embodiment of FIG. 6, the device according to the invention uses many reference clock signals, which principally have the same frequency. In practice, due to the manufacturing inaccuracies, these are signals having very close frequencies. In the device according to the invention, e.g. sixty-four 125 MHz quartz oscillators may be used for this purpose. Compared to their own intermediate frequencies, the oscillators have a characteristic deviation of 15 to 20 ppm (parts per million). To make sure that the application of independent reference signals has a jitter reducing effect, it is necessary to avoid a coupling either between the output signals or between each output signal and the power supply. In an opposite case, the crystal oscillators emitting each reference signal may be subjected to synchronisation and yield a synchronised output signal. From the many incoming signals, during the calibration, the FPGA-D may measure the conceptual accurate frequency of the reference signals and the deviation of each crystal oscillator. Due to the calibration of reference signals, reliable frequency information is available about each reference signal.

The more oscillators provide a reference signal, the more accurate measurement can be performed by the device according to the invention. Of course for many reference signal inputs, a larger calculation capacity is required on the FPGA-D. On the hardware side, the stabilised oscillator separated from the supply voltage by the filters described below occupies together with the elements of the filter a relatively large surface on the printed circuit board, and therefore the consumption of the oscillators is relatively high. An accurate oscillator with a low deviation is relatively expensive. The price, size and consumption of the device may be optimised at the expense of accuracy by the proper selection of the oscillator array size.

Figure 7:
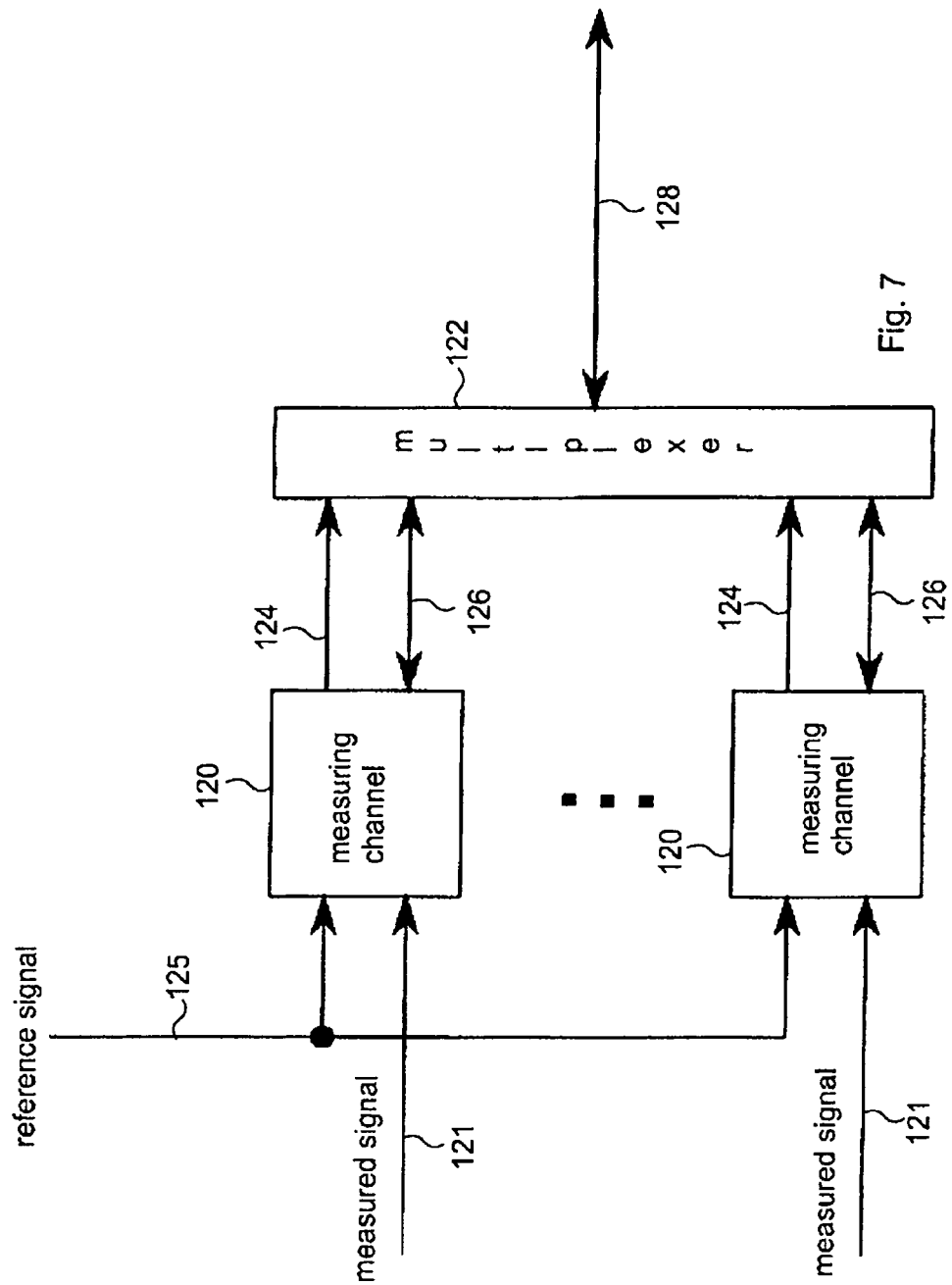
FIG. 7 is a block diagram showing a multi-channel embodiment of the device according to the invention.

FIG. 7 is a block diagram showing an embodiment of the device according to the invention. The figure shows a block diagram of such an embodiment which has several inputs adapted for receiving various measured signals 121, and each input is connected to each measuring channel 120 implemented e.g. according to the embodiment of FIG. 1 or FIG. 2. Reference signals 119 are also led to the measuring channels 120. In the centre of the figure, there are three dots to indicate that an arbitrary number of channels can be implemented, and the number of channels is practically limited only by the number of flip-flops arranged on the FPGA. Each of the measuring channels 120 are connected to a multiplexer 122 via a wiring 124; the measuring channels 120 transfer the bit flow obtained by sampling to the multiplexer 122. A readout control module may also be connected to the path consisting of the flip-flop units associated with the measuring channels 120, and it can be controlled through wirings 126. Through a wiring 128 connected to the multiplexer 122—e.g. via a bus of the LVDS type as described above—the measuring channels may be connected to the FPGA-D architecture described above. Accordingly, FIG. 7 principally shows the structure of an FPGA-A architecture described above.

Figure 8:
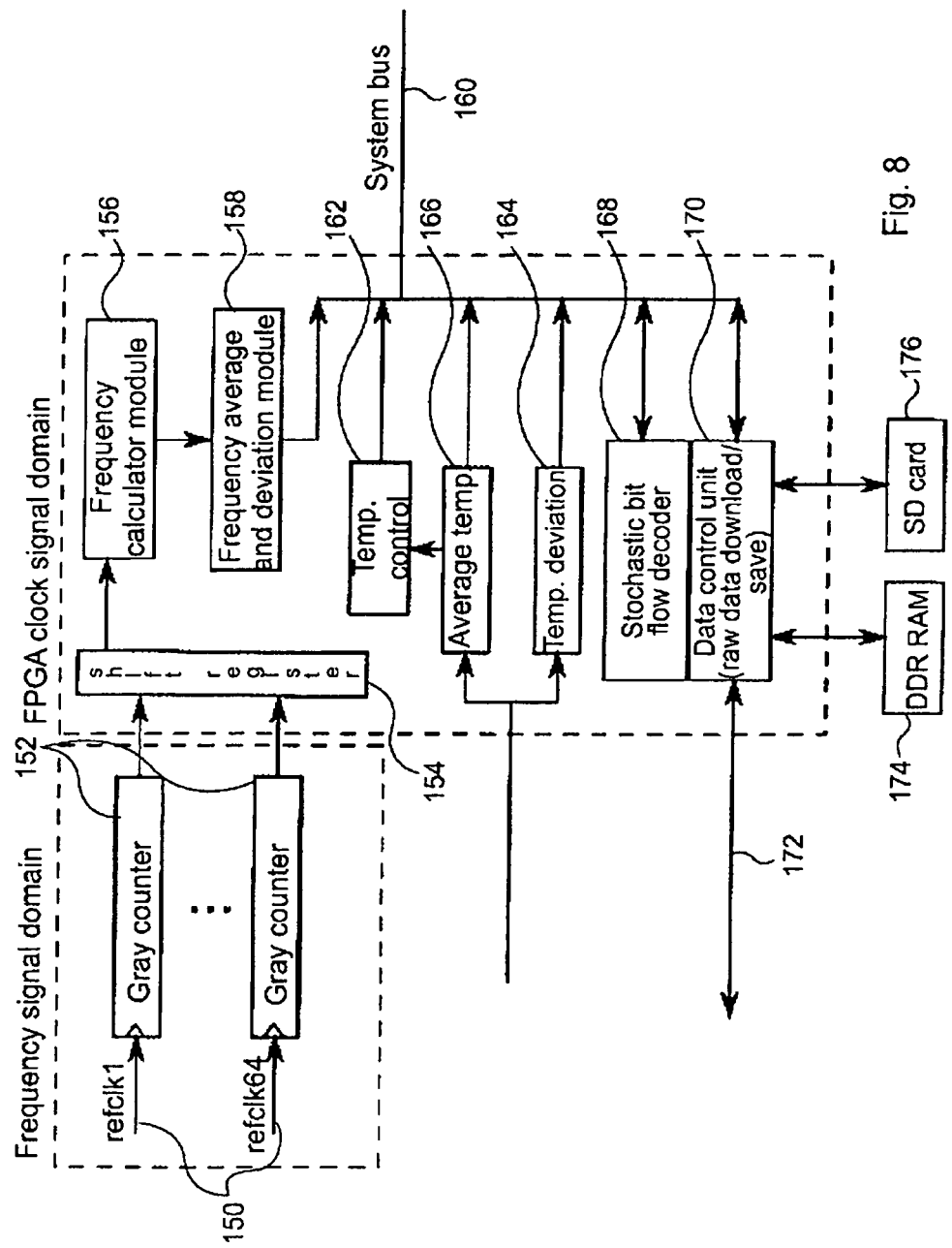
FIG. 8 is a block diagram of the block responsible for controlling the device according to the invention.

FIG. 8 is a block diagram of an FPGA-D architecture. In the figure, a wiring 172 is associated with the bus connecting the FPGA-A and FPGA-D architectures. For each reference signal 150, a Gray counter 152 is arranged on the FPGA-D, and these said counters are coupled to the digital control part of the FPGA-D. The control part has its own clock signal, i.e. in this case the clock signal is not substituted by an analogue signal like in the FPGA-A, but the FPGA architecture is used according to its original function. The signals coming from the Gray counters are collected by a shift register 154, and on the basis of these values, from time to time—with a given regularity—the frequencies of the reference signals are recalculated by means of a frequency calculator module 156. For the purpose of self-calibration or for the purpose of calibration with an atomic clock and a GPS module, respectively, the average of the frequencies and the deviation from the average are calculated by means of a frequency average and deviation module 158. The calculations of the reference signal are carried out preferably in each second. The FPGA comprises also the digital part of the temperature regulating circuit. The average of the temperature rates coming from the sensors is calculated by means of a module 166, and this is received by a preferably PID (proportional-integral-derivative) type temperature control 162, with the deviation of the temperatures calculated by a module 164. All data related to temperature, frequency and time calibration are supplied to a system bus 160 which is preferably of the I$^2$C type (http://en.wikipedia.org/wiki/I%C2%B2C).

According to FIG. 8, the FPGA-D preferably comprises a data control unit 170 receiving the raw measuring data from a wiring 172, i.e. from the LVDS bus of the FPGA-A, and these can be saved in and retrieved from a DDR RAM 174. The data control unit 170 is responsible also for data communication with an SD card 176. The data control unit 170 performs the saving of relevant calibration data from the system bus 160, and it is directly linked with a stochastic bit flow decoder 168, which is able to process the raw measured data. The commands received by the various control units are passed on by the system bus 160.

Figure 9:
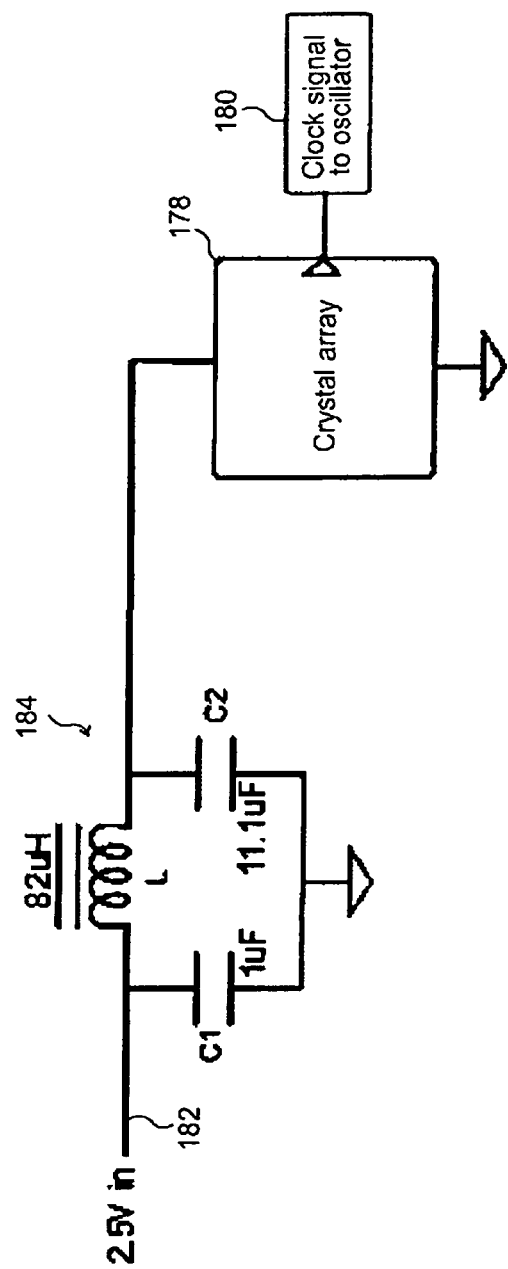
FIG. 9 is a drawing showing the separation of a power supply of the oscillators.

FIG. 9 shows such a detail of an embodiment comprising a crystal array 178 or at least one reference transmitter, and the supply voltage is fed to the reference transmitters via a filter—e.g. through a power supply filter 184. A dedicated power supply filter 184 is associated with each crystal oscillator. According to the figure, the power supply filter 184 of each power supply generating the reference signal consists of two capacitors and one coil. The power supply filter performs noise filtering on the signal of the supply voltage and is physically located in the immediate vicinity of the associated crystal oscillator, characteristically within 1 cm.

The accuracy of power supply, i.e. the fluctuation of such a signal may influence the propagation time of measured signal on the FPGA. According to the discussion above, it may also have an impact on the frequency of quartz oscillators. The appropriately accurate voltage may be generated e.g. by means of relatively high current linear regulators manufactured for generating the reference voltage. In the case of known supply voltage stabilisation approaches, a voltage slightly higher than the required voltage is fed to the facilities requiring supply voltage, and the device absorbs the extra energy by heating, thereby stabilising its output. This is not only a waste, but it would unnecessarily heat up the fluid applied as a cooling medium in some embodiments of the device according to the invention. The extra heat generated must be removed later on by a cooling unit, and therefore this known solution has a double waste. In order to reduce the heating effect, in one embodiment of the device according to the invention, two-stage power supplies are connected to at least some of the supply voltage demanding sub-units of the device. A two-stage power supply can be created by the application of a high efficiency switching mode power supply, which reduces the incoming voltage so much that only a minimal extra energy is absorbed by heating up. The output voltage of switching mode, so-called step-down regulators is slightly noisy, and therefore similarly to the embodiment depicted by FIG. 9, this voltage is stabilised by guiding it through an LC filter. Various circuit components require different rates of the supply voltage, and what is more, because of the better supply isolation, preferably a separate power supply is provided for the various function modules. The device according to the invention characteristically has the following power supplies:

1.2V FPGA-A core voltage,
1.2V FPGA-D core voltage,
3.3V FPGA-A supply voltage,
3.3V FPGA-D supply voltage,
3.3V supply voltage for the time measuring module of the analogue FPGA,
1.5V DDR3 RAM memory supply voltage,
3.3V supply voltage for the ADC converter of the thermometer,
2.5V supply voltage for the analogue thermometer sensors,
2.5V supply voltage for the oscillators of the crystal array.

A separate regulator is associated with the listed parts in any case, but the switching mode step-down converters can be combined at some places in the power supply. The transfer of the supply voltage over a long wire is problematic, because the low voltage may drop significantly on a long cable. Therefore, the regulators must be kept on the electronics in any case. However, the switching mode step-down converters may be located a little further away, outside the cooled part.

Figure 10:
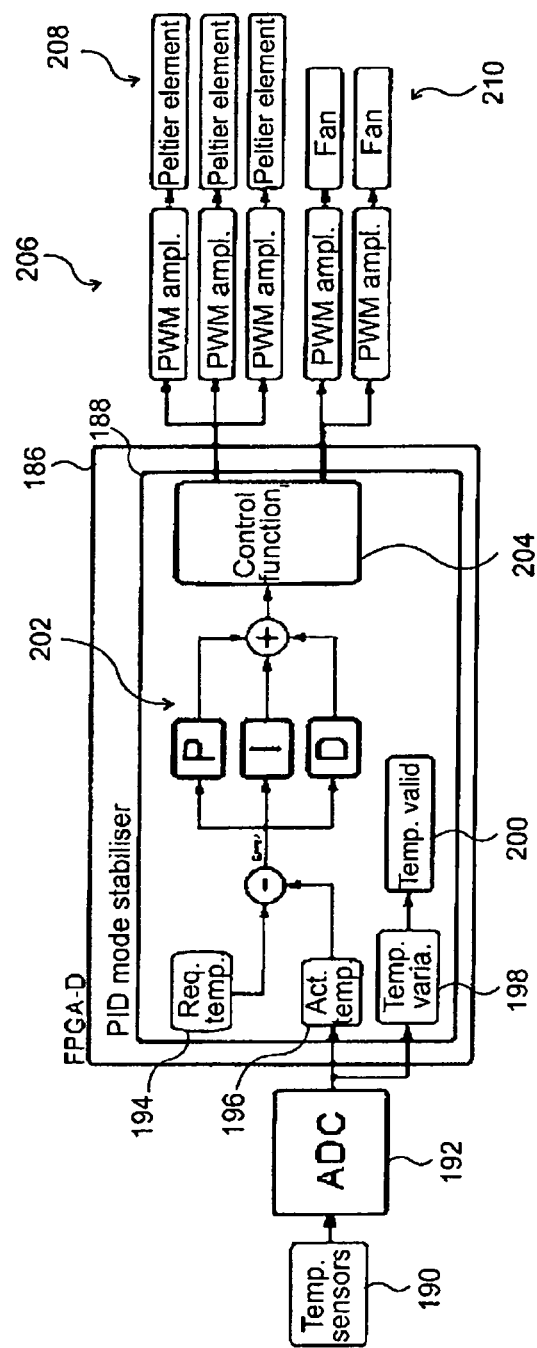
FIG. 10 is a block diagram showing the temperature control.

According to the discussion above, the device according to the invention is preferably cooled in order to reduce the thermal jitter. In such embodiments the device is placed into a cooling liquid so that it is cooled down to a cooled operational temperature, which is −40 to 0° C., preferably −10 to −30° C., and is especially preferably between −35 and −25° C. The cooled operational temperature is stabilised by a PID mode stabiliser 188 as shown in FIG. 10. The sub-units of the PID mode stabiliser 188 are described below.

Due to thermal stabilisation, the error caused by a change in temperature can be neglected from the aspect of the crystal oscillators. The low temperature reduces the thermal noise of electronic components, and thereby improves accuracy. The bottom limit of recommended cooled operating temperature is −40° C., because the industrially qualified components are calibrated to this temperature, and below this rate the semi-conductor components cannot operate optimally. The low temperature and thermal expansion (when cooled to −30° C. from a room temperature of 20° C., the difference is 50° C.) put a heavy load on the components. If the system is cooled down too quickly, the BGA (Ball Grid Array) encased components more sensitive to this may come off the printed circuit board, due to the different material and the different thermal expansion coefficient.

The implementation of cooling is shown in FIG. 10. In the cooling, the thermal pump is a 2-3 layer Peltier-element 208. Each Peltier-element 208 has a max. output of 100 to 150 W, but because of the multi-layer design it is not possible to have a 100% output on the side to be cooled. On the hot side of the Peltier-element 208, a large active fan based heat transfer block 210 is located.

On the panel to be thermally stabilised, preferably ten thermometer elements are arranged in one block of temperature sensors 190. They provide the current temperature data required for stabilisation. Preferably, the whole electronic panel is immersed in a liquid medium in order to ensure a uniform and high efficiency cooling. The cooling medium is preferably a pH-neutral, non-corroding, low freezing point fluid. In order to protect the electronic components, it is very important that the fluid should not react with the metal elements and it should not dissolve the plastic components either. The fluid is for example an electronically neutral frost resistant heat conducting material, e.g. ethyl alcohol based or Fluorinert (http://en.wikipedia.org/wiki/Fluorinert).

FIG. 10 shows other sub-units of the unit responsible for temperature stabilisation. In harmony with the discussion above, this sub-unit is arranged on an FPGA-D 186. The FPGA-D receives temperature values digitised by an analogue-digital converter 192, and this is controlled through a PID control circuit 202. The PID control circuit 202 regulates the temperature by means of the average of the sensors appearing on the module 196. The PID control circuit 202 receives the required temperature rate from a module 194. If the temperature variance between the sensors as determined by a module 198 is too high, this indicates the instability of temperature regulation to a module 200. According to the discussion above, the PID control circuit 202 controls the Peltier elements 208 driven by the PWM signal generated by PWM amplifiers 206 and fans 210. To make sure that the Peltier elements 208 and the fans 210 operate with an appropriate efficiency, an optimal regulation function is to be used in a control function module 204 of the PID control circuit 202.

For the Peltier elements 208, characteristically a 5V to 14V power supply is applied. In this power supply, a switching mode step-down converter is also located, detached by an LC filter enabling the regulation of the supply voltage, and therefore the cooling capacity can be varied. The LC filter is required, because the module is close to the electronics to be cooled, and a lot of noise would be introduced into the system by means of a simple PWM drive. For the fans of the heat exchanger block, characteristically a 12V supply voltage is applied. Furthermore, a 5V power supply may be applied for the embedded computer or for a display.

The invention also relates to a method for determining timing of a measured signal. In course of the method according to the invention, the measured signal and a secondary signal are led to a plurality of flip-flop units having a clock signal input adapted for receiving the measured signal and a data input adapted for receiving a secondary signal, and the output of the plurality flip-flop units is evaluated by an evaluation module. In the method according to the invention, a plurality of flip-flop units being on an FPGA architecture is used. The method according to the invention is carried out in a way that prior to leading the measured signal and the secondary signal to the flip-flop units, at least one path consisting of the flip-flop units is allocated by an allocating module, wherein the measured signal and the secondary signal are led to the flip-flop units of the at least one path; time difference parameters of each flip-flop unit are determined by means of a calibration module, and the time difference parameter specifying a time difference between a period of time in which the measured signal reaches the given flip-flop unit from an input point of the measured signal, and a period of time in which the secondary signal reaches the given flip-flop unit from an input point of the secondary signal, and the timing of the measured signal is determined from the output of the plurality of flip-flop units located along at least one path by means of the evaluation module on the basis of the time difference parameters.

In one embodiment of the method according to the invention, reference signals of essentially identical frequency generated by a plurality of reference transmitters are led as secondary signals to the data input of at least one flip-flop unit located along the at least one path. In a further embodiment of the method according to the invention, crystal oscillators oscillating independently of each other are applied as reference transmitters. In a yet further embodiment of the method according to the invention, the reference signals provided by a plurality of reference transmitters are calibrated by means of a reference calibration module using signal of an atomic clock or a GPS module.

In one embodiment of the method according to the invention, the reference signals are examined by Gray counters on the input of a reference calibration module.

In one embodiment of the method according to the invention, a first path and a second path are allocated by the allocating module, the measured signal is led to the clock signal input of the plurality of flip-flop units located along the first path, and a second measured signal is led as a secondary signal to the data input thereof, and the second measured signal is led to the clock signal input of the plurality of flip-flop units located along the second path, and the measured signal is led as a secondary signal to the data input thereof.

In another embodiment of the method according to the invention, a primary path and at least two secondary paths are allocated by the allocating module, the measured signal is led to the clock signal input of the plurality of flip-flop units located along the primary path, and the secondary signal is led to the data input thereof, measured signals with voltage shifts being different from each other for each secondary path are led to the clock signal inputs of the plurality flip-flop units located along the at least two secondary paths and the measured signals are led to the data inputs thereof.

In one embodiment of the method according to the invention, the device is immersed into a cooling fluid with the purpose of being cooled to a cooled operating temperature, which is between −40 and 0° C., preferably between −10 and −30° C., and especially preferably between −35 and −25° C., and the cooled operating temperature is stabilised by a PID mode stabiliser.

The invention is, of course, not limited to the preferred embodiments described in details above, but further variants, modifications and developments are possible within the scope of protection determined by the claims.

The invention claimed is:

1. A device for determining timing of a measured signal, the device comprising
    a plurality of flip-flop units each having a clock signal input for receiving the measured signal and a data input for receiving a secondary signal, and
    an evaluation module being adapted for evaluating outputs of the flip-flop units,
    characterised in that
    the flip-flop units are arranged on an FPGA architecture, the device comprises
        an allocating module for allocating at least one path consisting of flip-flop units, wherein the measured signal and the secondary signal are led to the flip-flop units of the at least one path, and
        a calibration module being adapted for determining a time difference parameter of each flip-flop unit, the time difference parameter specifying for each flip-flop unit a time difference between a period of time in which the measured signal reaches the given flip-flop unit from an input point of the measured signal and a period of time in which the secondary signal reaches the given flip-flop unit from an input point of the secondary signal, and wherein the evaluation module is adapted for determining the timing of the measured signal from the output of the flip-flop units located along the at least one path, on the basis of the time difference parameters.

2. The device according to claim 1, characterised by comprising a plurality of reference transmitters adapted for generating essentially identical frequency reference signals, and the reference signals are led as a plurality of secondary signals to a data input of at least one flip-flop unit located along the at least one path.

3. The device according to claim 2, characterised in that the reference transmitters arc crystal oscillators oscillating independently of each other.

4. The device according to claim 2, characterised in that the reference signals generated by the plurality of reference transmitters are calibrated by a reference calibration module based on a signal of an atomic clock or a GPS module.

5. The device according to claim 4, characterised by comprising Gray counters representing the input of the reference calibration module and being adapted for examining the reference signials.

6. The device according to claim 1, characterised in that
a first path and a second path are allocated by the allocating module,
the measured signal is led to the clock signal input of the plurality of flip-flop units located along the first path, and a second measured signal is led as a secondary signal to the data input thereof, and
the second measured signal is led to the clock signal input of the plurality of flip-flop units located along the second path, and the measured signal is led as a secondary signal to the data input thereof.

7. The device according to claim 1, characterised in that
a primary path and at least two secondary paths are allocated by the allocating module,
the measured signal is led to the clock signal input of the plurality of flip-flop units located along the primary path, and the secondary signal is led to the data input thereof,
measured signals with voltage shifts being different from each other for each secondary path are led to the clock signal inputs of the plurality of flip-flop units located along the at least two secondary paths, and the measured signals are led to the data input thereof.

8. The device according to claim 1, characterised by comprising
a readout control module adapted for emitting a control signal,
multiplexers receiving the control signal, being connected to the data input of the plurality of flip-flop units located along the at least one path, and having a first input connected to the output of the flip-flop unit located preceding along the at least one path or to the output of the readout control module, and having a second input adapted for receiving the secondary signal, and
the secondary signal is led through the multiplexers to the data inputs of the plurality of flip-flop units, and by means of the multiplexers their output receives the secondary signal in the case of receiving a measuring mode control signal, or
the signal arriving at their first input when receiving a readout mode control signal.

9. The device according to claim 1, characterised by comprising
a readout control module adapted for emitting a control signal,
at least one shift register receiving the control signal and being connected to the output of the plurality of flip-flop units located along the at least one path.

10. The device according to claim 1, characterised in that
the device immersed into a cooling fluid is cooled to a cooled operating temperature,
the cooled operating temperature is between −40 and 0° C., preferably between −10 and −30° C., and especially preferably between −35and −25° C., and
the cooled operating temperature is stabilised by a PID mode stabiliser.

11. The device according to claim 1, characterised in that
the plurality of flip-flop units is arranged on a first FPGA architecture and
the allocating module, the calibration module and the evaluation module are arranged on a second FPGA architecture.

12. The device according to claim 1, characterised in that at least a part of sub-units requiring supply voltage in the device are connected through a power supply filter to a power supply.

13. The device according to claim 12, characterised in that two-stage power supplies are connected to at least a part of the sub-units requiring supply voltage in the device.

14. A method for determining timing of a measured signal, comprising
leading the measured signal and a secondary signal to a plurality of flip-flop units having a clock signal input adapted for receiving the measured signal and a data input adapted for receiving a secondary signal, and
evaluating the output of the flip-flop units by an evaluation module,
characterised in that
flip-flop units arranged on an FPGA architecture are used in the method,
prior to the leading of the measured signal and the secondary signal to the flip-flop units, allocating by means of an allocating module at least one path consisting of the flip-flop units wherein the measured signal and the secondary signal arc led to the flip-flop units of the at least one path,
determining time difference parameters of each flip-flop unit by means of the calibration module, the time difference parameter specifying for each flip-flop unit a time difference between a period of time in which the measured signal reaches the given flip-flop unit from an input point of the said measured signal, and a period of time in which the secondary signal reaches the given flip-flop unit from an input point of the said secondary signal to the given flip-flop unit, and
determining the timing of the measured signal from the evaluation of the output of the plurality of flip-flop units located along the at least one path by means of the evaluation module on the basis of the time difference parameters.

15. The method according to claim 14, characterised in that reference signals of essentially identical frequency generated by a plurality of reference transmitters are led as secondary signals to the data input of at least one flip-flop unit located along the at least one path.

16. The method according to claim 15, characterised in that crystal oscillators oscillating independently of each other are applied as reference transmitters.

17. The method according to claim 15, characterised in that the reference signals provided by the plurality of reference transmitters are calibrated by means of a reference calibration module using signal of an atomic clock or a GPS module.

18. The method according to claim 17, characterised in that the reference signals are examined by Gray counters on the input of the reference calibration module.

19. The method according to claim 14, characterised in that
- a first path and a second path are allocated by the allocating module,
- the measured signal is led to the clock signal input of the plurality of flip-flop units located along the first path, and a second measured signal is led as a secondary signal to the data input thereof, and
- the second measured signal is led to the clock signal input of the plurality of flip-flop units located along the second path, and the measured signal is led as a secondary signal to the data input thereof.

20. The method according to claim 14, characterised in that
- a primary path and at least two secondary paths are allocated by the allocating module,
- the measured signal is led to the clock signal input of the plurality of flip-flop units located along the primary path, and the secondary signal is led to the data input thereof,
- measured signals with voltage shifts being different from each other for each secondary path are led to the clock signal inputs of the plurality of flip-flop units located along the at least two secondary paths, and the measured signals are led to the data input thereof.

21. The method according to claim 14, characterised in that
- the device is immersed into a cooling fluid to be cooled to cooled operating temperature, and the cooled operating temperature is between −40 and 0° C., preferably between −10 and −30° C., and especially preferably between −35 and −25° C., and
- the cooled operating temperature is stabilised by a PID mode stabiliser.

* * * * *